United States Patent
Cho

(10) Patent No.: US 10,446,599 B2
(45) Date of Patent: Oct. 15, 2019

(54) IMAGE SENSOR WITH PHASE DIFFERENCE DETECTION PIXEL

(71) Applicant: SK hynix Inc., Gyeonggi-do (KR)

(72) Inventor: Minsu Cho, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/709,848

(22) Filed: Sep. 20, 2017

(65) Prior Publication Data
US 2018/0254297 A1 Sep. 6, 2018

(30) Foreign Application Priority Data
Mar. 6, 2017 (KR) .................. 10-2017-0028057

(51) Int. Cl.
*H01L 27/146* (2006.01)

(52) U.S. Cl.
CPC .. *H01L 27/14627* (2013.01); *H01L 27/14609* (2013.01); *H01L 27/14667* (2013.01)

(58) Field of Classification Search
None
See application file for complete search history.

(56) References Cited

U.S. PATENT DOCUMENTS

| 2015/0350529 A1 | 12/2015 | Kato et al. |
| 2016/0071896 A1 | 3/2016 | Kawabata et al. |
| 2017/0186795 A1* | 6/2017 | Tsai .................. H01L 27/14627 |

* cited by examiner

*Primary Examiner* — Long Pham
(74) *Attorney, Agent, or Firm* — IP & T Group LLP

(57) ABSTRACT

An image sensor includes a pixel array having a plurality of pixels arranged therein. At least any one of the plurality of pixels include: a photoelectric conversion unit including first and second photoelectric conversion elements; a first sub-lens formed over the first photoelectric conversion element, and having a vertex out of a central axis of the first photoelectric conversion element; a second sub-lens formed over the second photoelectric conversion element, and having a vertex out of a central axis of the second photoelectric conversion element; and a microlens formed over the photoelectric conversion element so as to overlap the first and second sub-lenses. The first sub-lens is symmetrical with the second sub-lens, based on a boundary surface between the first and second photoelectric conversion elements.

19 Claims, 5 Drawing Sheets

IMAGE SENSOR WITH PHASE DIFFERENCE DETECTION PIXEL

CROSS-REFERENCE TO RELATED APPLICATIONS

This application claims priority under 35 U.S.C. § 119 to Korean Patent Application No. 10-2017-0028057 filed on Mar. 6, 2017, the disclosure of which is herein incorporated by reference in its entirety.

TECHNICAL FIELD

Exemplary embodiments of the present invention relate to a semiconductor device fabrication technology, and more particularly, to an image sensor with a phase difference detection pixel.

DISCUSSION OF THE RELATED ART

An image sensor refers to a device that converts an optical image into an electrical signal. Recently, with the development of computer industry and communication industry, the demand for an enhanced image sensor with a high integration density is increasing in various devices such as a digital camera, a camcorder, a Personal Communication System (PCS), a game machine, a security camera, a medical micro-camera and a robot.

SUMMARY

Various embodiments are directed to an image sensor with enhanced performance.

In an embodiment, there is provided an image sensor including a pixel array having a plurality of pixels arranged therein, wherein at least any one of the plurality of pixels may include: a photoelectric conversion unit including first and second photoelectric conversion elements; a first sub-lens formed over the first photoelectric conversion element, and having a vertex misaligned from a central axis of the first photoelectric conversion element; a second sub-lens formed over the second photoelectric conversion element, and having a vertex misaligned from a central axis of the second photoelectric conversion element; and a microlens formed over the photoelectric conversion element so as to overlap the first and second sub-lenses, wherein the first sub-lens is symmetrical with the second sub-lens, relative to a boundary surface between the first and second photoelectric conversion elements.

The image sensor may further include a color filter layer. The color filter layer may be formed over the photoelectric conversion element to cover the first and second sub-lenses. The microlens may be formed over the color filter layer.

The vertexes of the first and second sub-lenses may be adjacent to a central axis of the microlens. Each of cross-sections of the first and second sub-lenses, taken in a second direction, may have an asymmetric convex lens shape. Each of cross-sections of the first and second sub-lenses, taken in a first direction intersecting with the second direction, may have a bar shape. Each of cross-sections of the first and second sub-lenses, taken in a first direction intersecting with the second direction, may have a hemispherical shape.

The vertex of the first sub-lens may be located between the central axis of the microlens and the central axis of the first photoelectric conversion element, and the vertex of the second sub-lens nay be located between the central axis of the microlens and the central axis of the second photoelectric conversion element. The vertexes of the first and second sub-lenses, the first and second sub-lenses being located in the center of the pixel array, are more adjacent to the central axis of the microlens than the central axes of the first and second photoelectric conversion elements, respectively, and the vertexes of the first and second sub-lenses, the first and second sub-lenses being located at the edge of the pixel array, are more adjacent to the central axes of the first and second photoelectric conversion elements, respectively, than the central axis of the microlens.

The first and second sub-lenses may be formed by etching a substrate in which the first and second photoelectric conversion elements are formed. A bottom area of the first sub-lens and a bottom area of the second sub-lens may be equal to or larger than a light receiving area of the first photoelectric conversion element and a light receiving area of the second photoelectric conversion element, respectively.

In an embodiment, there is provided an image sensor including a pixel array having a plurality of pixels arranged therein, wherein at least any one of the plurality of pixels may include: a photoelectric conversion unit including first and second photoelectric conversion elements; a first sub-lens formed over the first photoelectric conversion element, and having a vertex misaligned from a central axis of the first photoelectric conversion element; a second sub-lens formed over the second photoelectric conversion element, and having a vertex misaligned from a central axis of the second photoelectric conversion element; an isolation pattern surrounding the first and second sub-lenses; and a microlens formed over the photoelectric conversion element so as to overlap the first and second sub-lenses, wherein the first sub-lens is symmetrical with the second sub-lens, relative to the boundary surface between the first and second photoelectric conversion elements.

The image sensor may further include a color filter layer. The color filter layer may be formed over the photoelectric conversion element to cover the first and second sub-lenses and including the isolation pattern formed therein. The microlens may be formed over the color filter layer. The isolation pattern may include a material having a smaller refractive index than the color filter layer.

The vertexes of the first and second sub-lenses may be adjacent to a central axis of the microlens. Each of cross-sections of the first and second sub-lenses, taken in a second direction, may have an asymmetric convex lens shape. Each of cross-sections of the first and second sub-lenses, taken in a first direction intersecting with the second direction, may have a bar shape. Each of cross-sections of the first and second sub-lenses, taken in a first direction intersecting with the second direction, may have a hemispherical shape.

The vertex of the first sub-lens may be located between the central axis of the microlens and the central axis of the first photoelectric conversion element, and the vertex of the second sub-lens nay be located between the central axis of the microlens and the central axis of the second photoelectric conversion element. The vertexes of the first and second sub-lenses, the first and second sub-lenses being located in the center of the pixel array, are more adjacent to the central axis of the microlens than the central axes of the first and second photoelectric conversion elements, respectively, and the vertexes of the first and second sub-lenses, the first and second sub-lenses being located at the edge of the pixel array, are more adjacent to the central axes of the first and second photoelectric conversion elements, respectively, than the central axis of the microlens.

The first and second sub-lenses may be formed by etching a substrate in which the first and second photoelectric conversion elements are formed. The bottom area of the first sub-lens and the bottom area of the second sub-lens may be equal to or larger than a light receiving area of the first photoelectric conversion element and a light receiving area of the second photoelectric conversion element, respectively.

DETAILED DESCRIPTION

Figure 1:
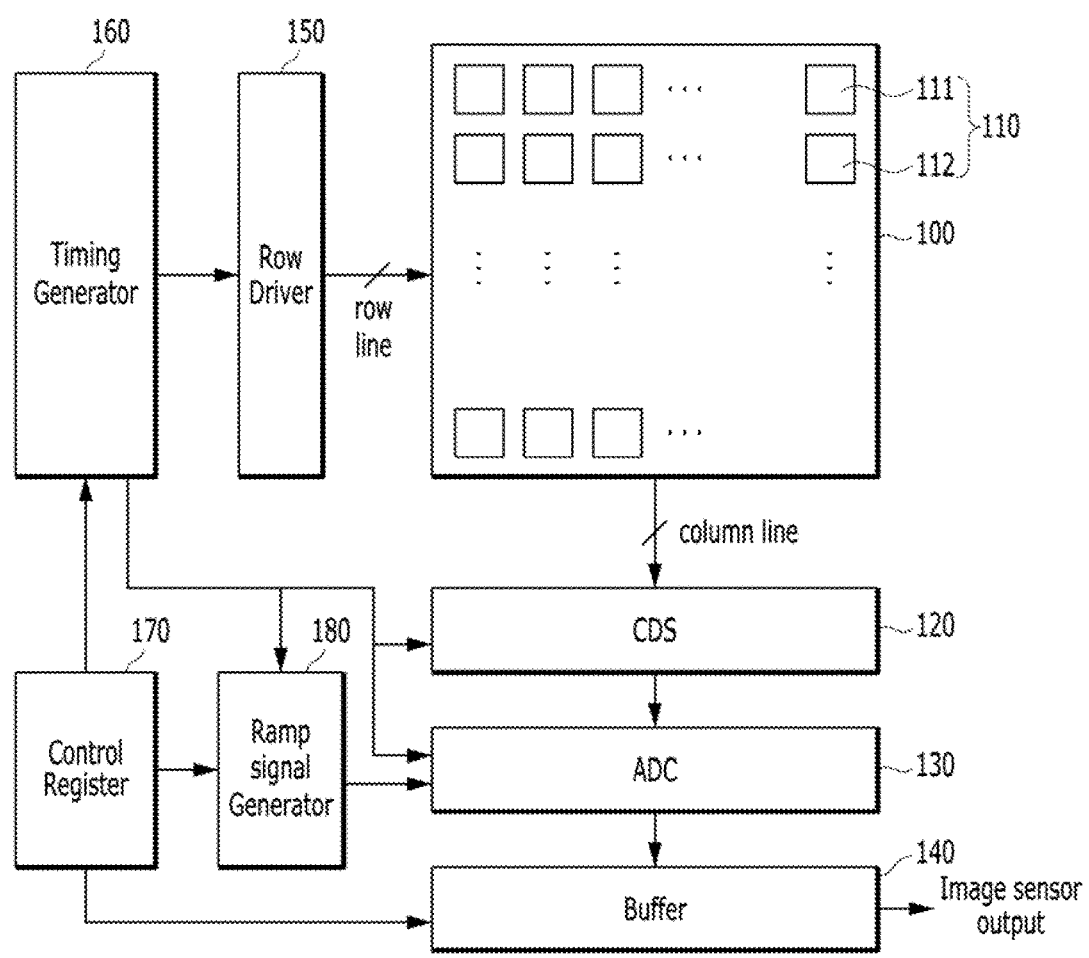
FIG. 1 is a block diagram schematically illustrating an image sensor in accordance with an embodiment of the present invention.

Various embodiments will be described below in more detail with reference to the accompanying drawings. The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure for example, one or more additional layers may be present between two illustrated layers. As a specific example, when a first layer in a described or illustrated multi-layer structure is referred to as being "on" or "over" a second layer or "on" or "over" a substrate, the first layer may be directly formed on the second layer or the substrate but may also represent a structure in which one or more other intermediate layers may exist between the first layer and the second layer or the substrate.

Various embodiments may provide a method capable of improving a performance of an image sensor with a phase difference detection pixel. Specifically, the various embodiments may provide an image sensor capable of improving a sensitivity of a phase difference detection pixel, and preventing an occurrence of optical crosstalk in the phase difference detection pixel. For this operation, the image sensor may include a sub-lens installed between a photo- electric conversion element and a microlens and having a vertex misaligned from a central axis of the photoelectric conversion element.

FIG. 1 is a block diagram schematically illustrating an image sensor in accordance with an embodiment of the present invention.

Referring to FIG. 1, the image sensor may include a pixel array 100, a correlated double sampler (CDS) 120, an analog-digital converter (ADC) 130, a buffer 140, a row driver 150, a timing generator 160, a control register 170 and a ramp signal generator 180. The pixel array 100 may include a plurality of pixels 110 arranged in a matrix structure.

The timing generator 160 may generate one or more control signals for controlling the respective operations of the row driver 150, the correlated double sampling 120, the analog-digital converter 130 and the ramp signal generator 180. The control register 170 may generate one or more control signals for controlling the respective operations of the ramp signal generator 180, the timing generator 160 and the buffer 140.

The row driver 150 may drive the pixel array 100 row line by row line. For example, the row driver 150 may generate a select signal for selecting any one row line among a plurality of row lines. The plurality of row lines may be coupled with the plurality of pixels 110, respectively. One row line is coupled to each of the plurality of pixels 110 arranged in the same row.

Each of the plurality of pixels 110 may sense incident light, and output an image reset signal and an image signal to the correlated double sampling 120 through a column line. The correlated double sampling 120 may perform a sampling for each of the image reset signal and the image signal received therein. The plurality of pixels 110 may be coupled to a plurality of column lines, respectively. One column line may be coupled to each of the plurality of pixels 110 arranged in the same column. The analog-digital converter 130 may compare a ramp signal outputted from the ramp signal generator 180 and a sampling signal outputted from the correlated double sampling 120 to output a comparison signal. The analog-digital converter 130 may count a level transition time of the comparison signal according to a clock signal provided from the timing generator 160 to output a count value to the buffer 140. The ramp signal generator 180 may operate under control of the timing generator 160.

The buffer 140 may store a plurality of digital signals outputted from the analog-digital converter 130, sense and amplify the respective digital signals, and output resultant signals. Thus, the buffer 140 may include a memory (not shown) and a sense amplifier (not shown). The memory may be to store the count values, and the count values may be associated with the signals outputted from the plurality of pixels 110. The sense amplifier may sense and amplify the respective count values outputted from the memory.

Figure 2:
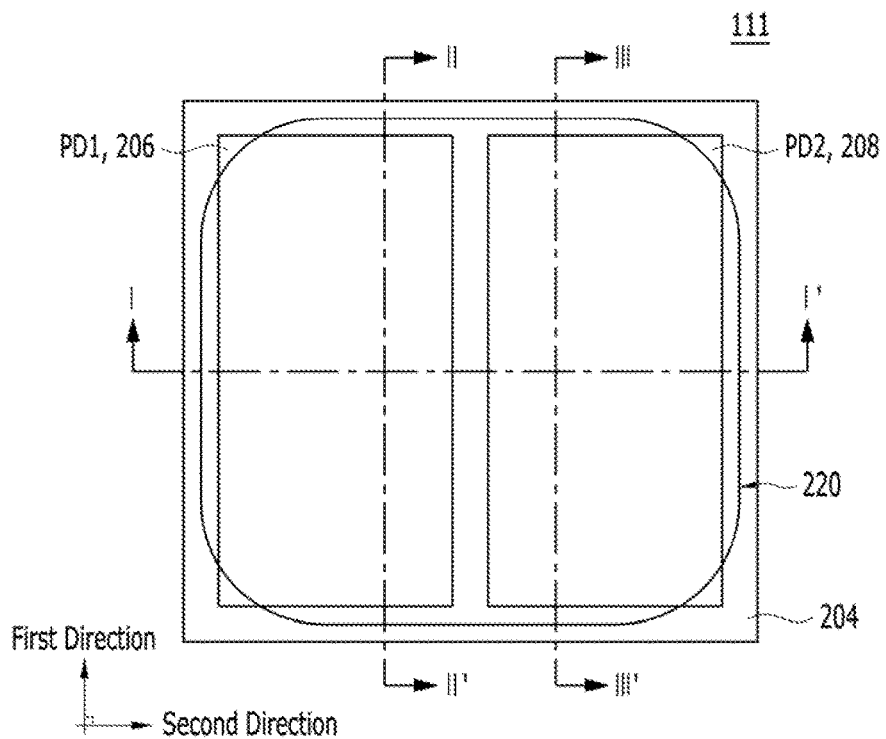
FIG. 2 is a plane view illustrating a phase difference detection pixel of an image sensor in accordance with a first embodiment of the present invention.
Figure 3:
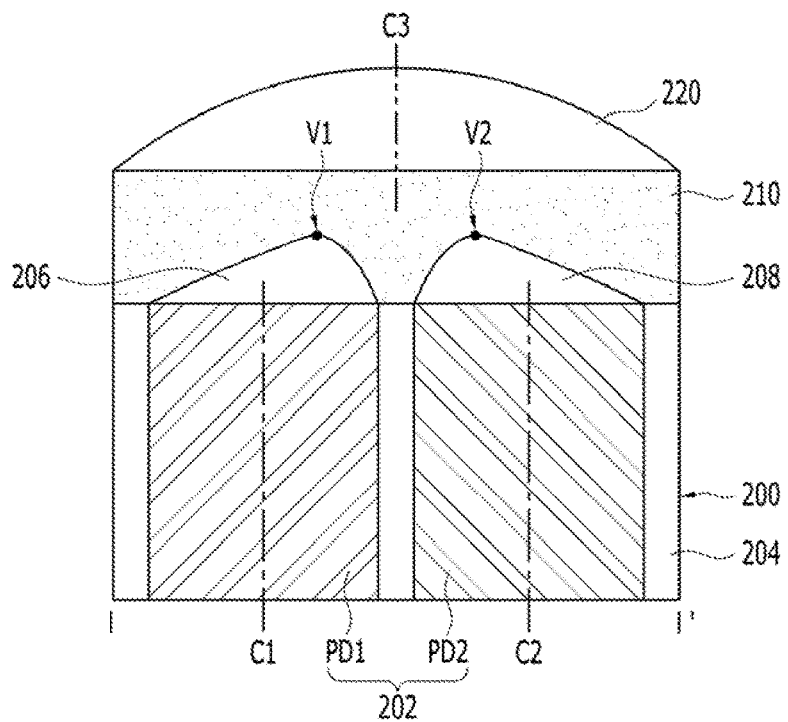
FIG. 3 is a cross-sectional view taken along line I-I' of FIG. 2.

FIG. 2 is a plane view illustrating a phase difference detection pixel of an image sensor in accordance with a first embodiment of the present invention. FIG. 3 is a cross-sectional view taken along line I-I' of FIG. 2.

As illustrated in FIGS. 1 to 3, the image sensor in accordance with the first embodiment may include the pixel array 100 having the plurality of pixels 110 arranged in a matrix structure, and at least any one of the plurality of pixels 110 may serve as a phase difference detection pixel 111. For example, the pixel array 100 may include image detection pixels 121 for acquiring an image and phase difference detection pixels 111 for acquiring information such as a focal point and depth. The phase difference detection pixels 111 and the image detection pixels 121 may have the same pixel area. In another embodiment, although not illustrated, the pixel array 100 may include only the phase difference detection pixels 111.

The phase difference detection pixel 111 may include a photoelectric conversion unit 202, a first sub-lens 206, a second sub-lens 208, a color filter layer 210 and a microlens 220. The photoelectric conversion unit 202 may include first and second photoelectric conversion elements PD1 and PD2. The first sub-lens 206 may be formed on the first photoelectric conversion element PD1, and have a vertex V1 misaligned from a central axis C1 of the first photoelectric conversion element PD1. The second sub-lens 208 may be formed on the second photoelectric conversion element PD2, and have a vertex V2 misaligned from a central axis C2 of the second photoelectric conversion element PD2. The color filter layer 210 may be formed on the photoelectric conversion unit 202 so as to cover the first and second sub-lenses 206 and 208. The microlens 220 may be formed on the color filter layer 210 so as to overlap the photoelectric conversion unit 202.

The photoelectric conversion unit 202 may include the first and second photoelectric conversion elements PD1 and PD2 isolated by an isolation structure 204. The isolation structure 204 and the photoelectric conversion unit 202 may be formed in a substrate 200. The substrate 200 may include a semiconductor substrate. The semiconductor substrate may have a single crystal state, and include a silicon containing material. That is, the substrate 200 may include a single-crystal silicon containing material.

The first and second photoelectric conversion elements PD1 and PD2 may include an organic or inorganic photodiode. For example, the first and second photoelectric conversion elements PD1 and PD2 may be formed on the substrate 200, and have a structure in which a P-type impurity region (not illustrated) and an N-type impurity region (not illustrated) having complementary conductive types are stacked in the vertical direction. The central axes C1 and C2 of the first and second photoelectric conversion elements PD1 and PD2, which are indicated by alternated long and short dash lines in FIG. 3, may serve as optical axes thereof, and correspond to normal lines which are vertically extended from the centers of the light receiving surfaces of the first and second photoelectric conversion elements PD1 and PD2. Furthermore, although not illustrated, the image detection pixel 112 may include one photoelectric conversion element within the same pixel area as the phase difference detection pixel 111. Therefore, each of the first and second photoelectric conversion elements PD1 and PD2 may have a light receiving area corresponding to a half of the light receiving area of the photoelectric conversion element in the image detection pixel 112.

The first and second photoelectric conversion elements PD1 and PD2 may have major and minor axes, and have a bar-type planar shape of which the major axis is extended in a first direction. Therefore, the first and second photoelectric conversion elements PD1 and PD2 may be isolated from each other in a second direction, or isolated from each other in a side-to-side direction. In the first embodiment, the first and second photoelectric conversion elements PD1 and PD2 may be isolated from each other in the second direction. However, depending on the location of the phase difference detection pixel 111 in the pixel array 100, the first and second photoelectric conversion elements PD1 and PD2 may be isolated from each other in the first direction or isolated from each other in the top and bottom direction. In this case, the first and second photoelectric conversion elements PD1 and PD2 may have a bar-type planar shape of which the major axis is extended in the second direction.

The isolation structure 204 may isolate the first and second photoelectric conversion elements PD1 and PD2 from each other, and surround the photoelectric conversion unit 202. That is, the isolation structure 204 may surround the first and second photoelectric conversion elements PD1 and PD2. The isolation structure 204 may include STI (Shallow Trench Isolation), DTI (Deep Trench Isolation) or a potential barrier. The potential barrier may include an impurity region formed by implanting impurities into the substrate 200, for example, a P-type impurity region. In the first embodiment, the isolation structure 204 may be formed with DTI.

The color filter layer 210, which is formed on the photoelectric conversion unit 202 so as to cover the first and second sub-lenses 206 and 208, may include any one single layer selected from a group consisting of a red filter, green filter, blue filter, cyan filter, yellow filter, magenta filter, white filter, black filter and IR cutoff filter or a multilayer formed of two or more layers thereof. For reference, the white filter may serve as a filter capable of transmitting a visible incident light or a visible incident light and an infrared incident light.

The microlens 220 formed on the color filter layer 210 may include a digital lens or hemispherical lens. The microlens 220 may overlap the photoelectric conversion unit 202. That is, the microlens 220 may overlap the first and second sub-lenses 206 and 208. Depending on the location of the phase difference detection pixel 111 in the pixel array 100, an overlap area between the microlens 220 and the first sub-lens 206 may differ from an overlap area between the microlens 220 and the second sub-lens 208. For reference, the central axis C3 of the microlens 220, indicated by an alternate long and two short dashes line in FIG. 3, may serve as an optical axis, and correspond to a normal line extended in the vertical direction from the vertex of the microlens 220.

The first and second sub-lenses 206 and 208 may not only improve the sensitivity of the phase difference detection pixel 111, but also prevent an optical crosstalk. For this operation, the vertexes V1 and V2 of the first and second sub-lenses 206 and 208 may be adjacent to the central axis C3 of the microlens 220. Therefore, cross-sections of the first and second sub-lenses 206 and 208, taken in the second direction, may have an asymmetric convex lens shape. Specifically, the vertex V1 of the first sub-lens 206 may be located between the central axis C3 of the microlens 220 and the central axis C1 of the first photoelectric conversion element PD1, and the vertex V2 of the second sub-lens 208 may be located between the central axis C3 of the microlens 220 and the central axis C2 of the second photoelectric conversion element PD2. Depending on the location of the phase difference detection pixel 111 in the pixel array 100, the locations of the vertexes V1 and V2 of the first and second sub-lenses 206 and 208 may be changed. Specifically, the closer the phase difference detection pixel 111 is located to the edge of the pixel array 100, the closer the vertexes V1 and V2 of the first and second sub-lenses 206 and 208 may be located to the central axes C1 and C2 of the first and second photoelectric conversion elements PD1 and PD2 rather than the central axis C3 of the microlens 220. Alternately, the closer the phase difference detection pixel 111 is located to the center of the pixel array 100, the closer the vertexes V1 and V2 of the first and second sub-lenses 206 and 208 may be located to the central axis C3 of the microlens 220 rather than the central axes C1 and C2 of the first and second photoelectric conversion elements PD1 and PD2. The vertex locations of the first and second sub-lenses 206 and 208 may be linearly changed depending on their locations in the pixel array 100.

In order to prevent optical crosstalk while improving the sensitivity of the phase difference detection pixel 111, the first and second sub-lenses 206 and 208 may have a symmetrical shape in the second direction. That is, relative to the boundary surface or boundary line between the first and second photoelectric conversion elements PD1 and PD2, the first sub-lens 206 may be symmetrical with the second sub-lens 208.

Furthermore, in order to prevent optical crosstalk while improving the sensitivity of the phase difference detection pixel 111, cross-sections of the first and second sub-lenses 206 and 208, taken in the first direction intersecting with the second direction, may have a different shape from the cross-sections of the first and second sub-lenses 206 and 208, taken in the second direction. Hereafter, referring to FIGS. 4A and 4B, the shapes of the cross-sections of the first and second sub-lenses 206 and 208, taken in the first direction, will be described in detail.

Figure 4A:
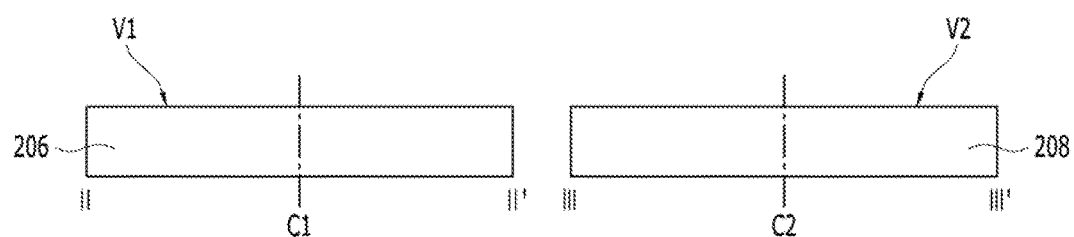
FIGS. 4A and 4B are cross-sectional views of first and second sub-lenses, taken along lines II-II' and III-III' of FIG. 2.
Figure 4B:
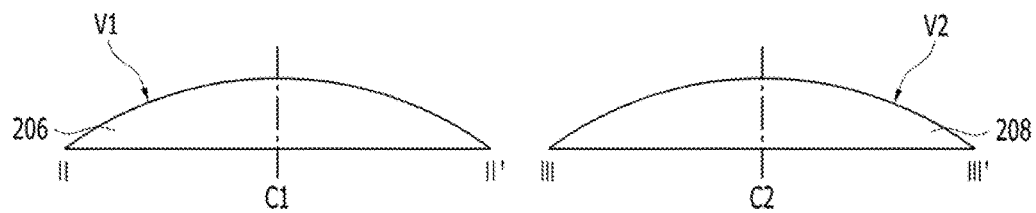

FIGS. 4A and 4B are cross-sectional views of the first and second sub-lenses, taken along lines II-II' and III-III' of FIG. 2. Line II-II' may correspond to a line along the vertex V1 of the first sub-lens 206, and Line III-III' may correspond to a line along the vertex V2 of the second sub-lens 208.

For example, referring to FIG. 4A, the vertexes V1 and V2 of the first and second sub-lenses 206 and 208 may maintain a constant level in the first direction. That is, each of the cross-sections of the first and second sub-lenses 206 and 208, taken in the first direction, may have a bar shape. The first and second sub-lenses 206 and 208 having the above-described shape may have a high mass productivity, and easily perform a pupil division on the incident light passing through the microlens 220, thereby effectively improving the sensitivity of the phase difference detection pixel 111.

For another example, referring to FIG. 4B, the vertexes V1 and V2 of the first and second sub-lenses 206 and 208 in the first direction may be located at the highest level in the central axes C1 and C2 of the first and second photoelectric conversion elements PD1 and PD2, and as the vertexes V1 and V2 are away from their central axes, the levels of the vertexes V1 and V2 may decrease. Moreover, each of the cross-sections of the first and second sub-lenses 206 and 208, taken in the first direction, may have a hemispherical shape. The first and second sub-lenses 206 and 208 having the above-described shape can improve the light condensing capability of the lens, thereby not only improving the sensitivity of the phase difference detection pixel 111, but also more effectively preventing an optical crosstalk caused by a propagation direction of the incident light passing through the microlens 220.

The first and second sub-lenses 206 and 208 may be formed by etching the substrate 200 in which the first and second photoelectric conversion elements PD1 and PD2 are formed. For example, the first and second sub-lenses 206 and 208 may include a single-crystal silicon containing material, and have an undoped state in which no impurities are doped. Furthermore, the first and second sub-lenses 206 and 208 may be formed by etching an insulating layer formed on the substrate 200. For example, the first and second sub-lenses 206 and 208 may include oxide, nitride, oxynitride and the like, and the insulating layer for forming the first and second sub-lenses 206 and 208 may include any one single layer selected from a group consisting of oxide, nitride and oxynitride or a multilayer formed of two or more layers.

The first and second sub-lenses 206 and 208 may be formed on the first and second photoelectric conversion elements PD1 and PD2 so as to completely overlap the first and second photoelectric conversion elements PD1 and PD2. For this structure, a bottom area of the first sub-lens 206 and a bottom area of the second sub-lens 208 may be equal to or larger than the light receiving area of the first photoelectric conversion element PD1 and the light receiving area of the second photoelectric conversion element PD2, respectively. Depending on the location of the phase difference detection pixel 111 in the pixel array 100, the first and second sub-lenses 206 and 208 may partially overlap the first and second photoelectric conversion elements PD1 and PD2, respectively.

As described above, the phase difference detection pixel 111 of the image sensor in accordance with the first embodiment may include the first and second sub-lenses 206 and 208, and improve the sensitivity of the phase difference detection pixel 111 while preventing an occurrence of the optical crosstalk between the first and second photoelectric conversion elements PD1 and PD2 in the phase difference detection pixel 111 and an occurrence of the optical crosstalk between the phase difference detection pixel 111 and adjacent pixels.

Figure 5:
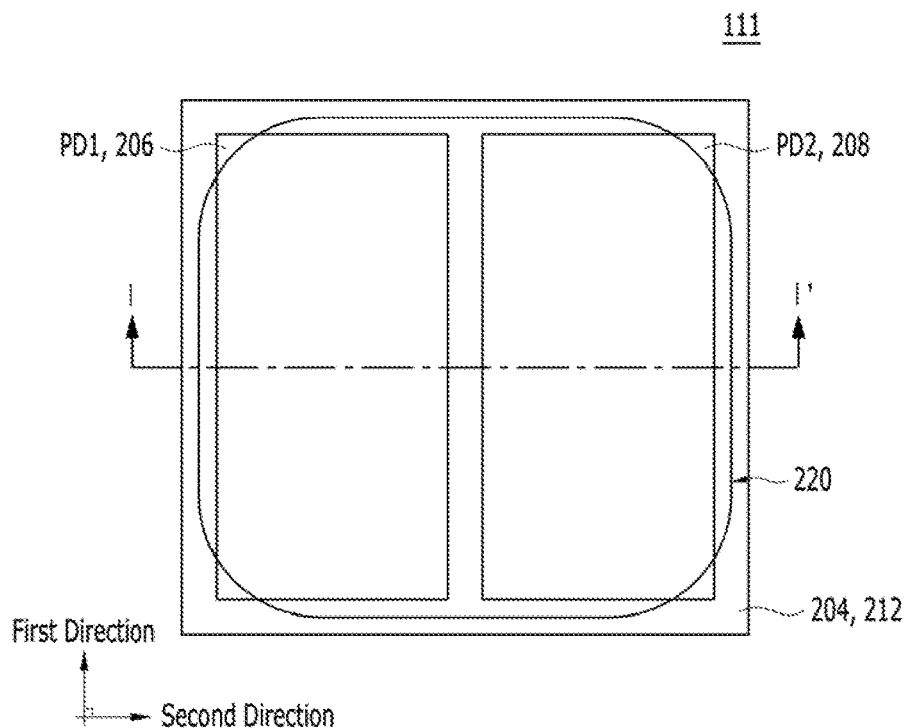
FIG. 5 is a plane view illustrating a phase difference detection pixel of an image sensor in accordance with a second embodiment of the present invention.
Figure 6:
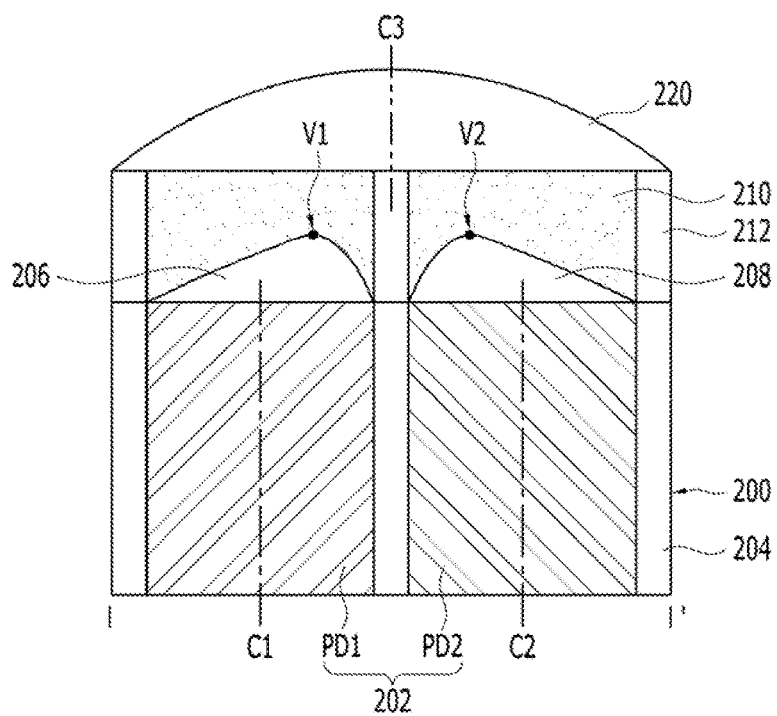
FIG. 6 is a cross-sectional view taken along line I-I' of FIG. 5.

FIG. 5 is a plane view illustrating a phase difference detection pixel of an image sensor in accordance with a second embodiment of the present invention, and FIG. 6 is a cross-sectional view taken along line I-I' of FIG. 5. Hereafter, the same reference numerals as those of the first embodiment may be used for convenience of description, and the detailed descriptions of the same components may be omitted herein.

As illustrated in FIGS. 1, 5 and 6, the image sensor in accordance with the second embodiment may include a pixel array 100 having a plurality of pixels 110 arranged in a matrix structure, and at least any one of the plurality of pixels 110 may serve as a phase difference detection pixel 111.

The phase difference detection pixel 111 may include a photoelectric conversion unit 202, a first sub-lens 206, a second sub-lens 208, a color filter layer 210, an isolation pattern 212 and a microlens 220. The photoelectric conversion unit 202 may include first and second photoelectric conversion elements PD1 and PD2. The first sub-lens 206 may be formed on the first photoelectric conversion element PD1, and have a vertex misaligned from a central axis C1 of the first photoelectric conversion element PD1. The second sub-lens 208 may be formed on the second photoelectric conversion element PD2, and have a vertex misaligned from a central axis C2 of the second photoelectric conversion element PD2. The color filter layer 210 may be formed on the photoelectric conversion unit 202 so as to cover the first and second sub-lenses 206 and 208. The isolation pattern 212 may be formed in the color filter layer 210 along the edges of the first and second sub-lenses 206 and 208. The microlens 220 may be formed on the color filter layer 210 so as to overlap the photoelectric conversion unit 202.

The isolation pattern 212 formed in the color filter layer 210 may serve to prevent a color mixing during a process of forming the color filter layer 210. The isolation pattern 212 may guide incident light passing through the microlens 220 into the first and second photoelectric conversion elements PD1 and PD2, thereby preventing optical crosstalk. For this operation, the isolation pattern 212 may overlap the isolation structure 204, and surround the first and second sub-lenses 206 and 208. The isolation pattern 212 may include a material having a lower refractive index than the color filter layer 210. For example, the isolation pattern 212 may include a material having a refractive index of 1.2 to 1.5. In order to prevent optical crosstalk, the isolation pattern 212 may have a line width of 50 nm to 250 nm, and have a thickness of 100 nm to 300 nm.

As described above, the phase difference detection pixel 111 of the image sensor in accordance with the second embodiment may include the first and second sub-lenses 206 and 208, and improve the sensitivity of the phase difference detection pixel 111 while preventing an occurrence of optical crosstalk between the first and second photoelectric conversion elements PD1 and PD2 in the phase difference detection pixel 111 and an occurrence of optical crosstalk between the phase difference detection pixel 111 and adjacent pixels.

Furthermore, the image sensor in accordance with the second embodiment may include the isolation pattern 212 to prevent optical crosstalk more effectively.

The image sensor in accordance with the above-described embodiments may be used in various electronic devices or systems. Hereafter, a case in which the image sensor in accordance with the embodiments is applied to a camera will be described with reference to FIG. 7.

Figure 7:
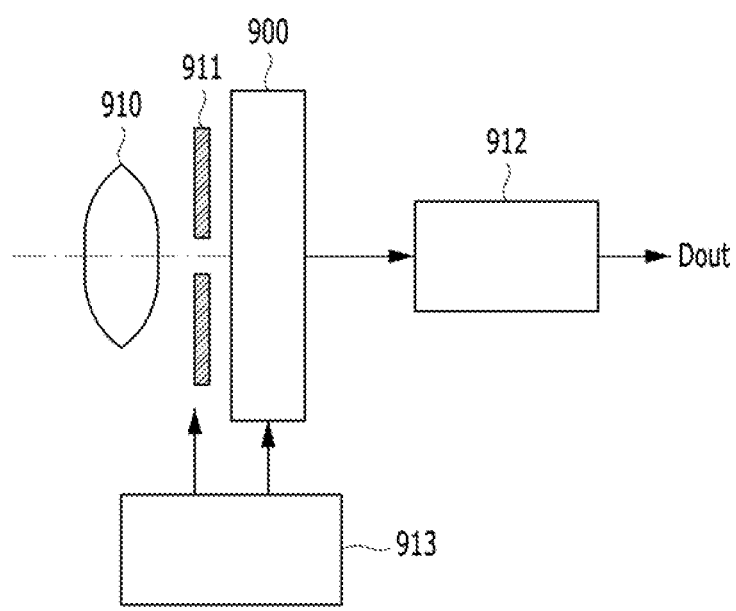
FIG. 7 is a diagram illustrating an electronic device with the image sensor in accordance with the embodiments of the present invention.

FIG. 7 is a diagram simply illustrating an electronic device with the image sensor in accordance with the embodiments.

Referring to FIG. 7, the electronic device including the image sensor in accordance with the embodiments may be a camera capable of taking a still image or a moving picture. The electronic device may include an optical system or optical lens 910, a shutter unit 911, an image sensor 900, a driving unit 913 for controlling/driving the image sensor 900 and the shutter unit 911, and a signal processing unit 912.

The optical system 910 may guide image light that is, incident light from an object, to a pixel array (see the reference numeral 100 of FIG. 1) of the image sensor 900. The optical system 910 may be constructed by a plurality of optical lenses. The shutter unit 911 may control a light irradiation period and a light shielding period for the image sensor 900. The driving unit 913 may control a transmission operation of the image sensor 900 and the shutter operation of the shutter unit 911. The signal processing unit 912 performs various kinds of signal processing for the signal outputted from the image sensor 900. An image signal Dout after the signal processing, may be stored in a storage medium such as a memory or be outputted to a monitor or the like.

As is apparent from the above descriptions, in the present technology, by providing the first sub-lens and the second sub-lens, the sensitivity of the phase difference detection pixel can be improved and optical crosstalk can be prevented.

Furthermore, by providing the isolation pattern, optical crosstalk can be prevented more effectively.

Although various embodiments have been described for illustrative purposes, it will be apparent to those skilled in the art that various changes and modifications may be made without departing from the spirit and scope of the invention as defined in the following claims.

What is claimed is:

1. An image sensor comprising a pixel array having a plurality of pixels arranged therein,
    wherein at least any one of the plurality of pixels comprises:
    a photoelectric conversion unit comprising first and second photoelectric conversion elements;
    a first sub-lens formed over the first photoelectric conversion element, and having a first vertex misaligned from a first central vertical axis of the first photoelectric conversion element;
    a second sub-lens formed over the second photoelectric conversion element, and having a second vertex misaligned from a second central vertical axis of the second photoelectric conversion element; and
    a microlens formed over the photoelectric conversion element to overlap the first and second sub-lenses,
    wherein the first sub-lens is symmetrical with the second sub-lens, relative to a boundary surface between the first and second photoelectric conversion elements.

2. The image sensor of claim 1, further comprising a color filter layer formed over the photoelectric conversion element to cover the first and second sub-lenses,
    wherein the microlens is formed over the color filter layer.

3. The image sensor of claim 1, wherein the first and second vertexes of the first and second sub-lenses are closer to a third central vertical axis of the microlens than edges of the microlens.

4. The image sensor of claim 1, wherein each of cross-sections of the first and second sub-lenses, taken in a vertical direction, has an asymmetric convex lens shape.

5. The image sensor of claim 4, wherein each of cross-sections of the first and second sub-lenses has a bar shape in a plan view.

6. The image sensor of claim 4, wherein each of the first and second sub-lenses has a hemispherical shape in a longitudinal cross-sectional view.

7. The image sensor of claim 1, wherein the first vertex of the first sub-lens is located between a third central vertical axis of the microlens and the first central vertical axis of the first photoelectric conversion element, and
    the second vertex of the second sub-lens is located between a third central vertical axis of the microlens and the second central vertical axis of the second photoelectric conversion element.

8. The image sensor of claim 1,
    wherein the first and second vertexes of the first and second sub-lenses located in a center of the pixel array, are closer to a third central vertical axis of the microlens than the first and second central vertical axes of the first and second photoelectric conversion elements, respectively, and
    the first and second vertexes of the first and second sub-lenses located at an edge of the pixel array are closer to the first and second central vertical axes of the first and second photoelectric conversion elements, respectively, than the third central vertical axis of the microlens.

9. The image sensor of claim 1, wherein a bottom area of the first sub-lens and a bottom area of the second sub-lens are equal to or larger than a light receiving area of the first photoelectric conversion element and a light receiving area of the second photoelectric conversion element, respectively.

10. An image sensor comprising a pixel array having a plurality of pixels arranged therein,
    wherein at least any one of the plurality of pixels comprises:
    a photoelectric conversion unit comprising first and second photoelectric conversion elements;

a first sub-lens formed over the first photoelectric conversion element, and having a first vertex misaligned from a first central vertical axis of the first photoelectric conversion element;

a second sub-lens formed over the second photoelectric conversion element, and having a second vertex misaligned from a second central vertical axis of the second photoelectric conversion element;

an isolation pattern formed over the photoelectric conversion unit, and surrounding the first and second sub-lenses; and a microlens formed over the photoelectric conversion element to overlap the first and second sub-lenses, wherein the first sub-lens is symmetrical with the second sub-lens, relative to the boundary surface between the first and second photoelectric conversion elements.

11. The image sensor of claim 10, further comprising a color filter layer formed over the photoelectric conversion element to cover the first and second sub-lenses and including the isolation pattern formed therein, wherein the microlens is formed over the color filter layer.

12. The image sensor of claim 11, wherein the isolation pattern comprises a material having a smaller refractive index than the color filter layer.

13. The image sensor of claim 10, wherein the first and second vertexes of the first and second sub-lenses are closer to a third central vertical axis of the microlens than edges of the microlens.

14. The image sensor of claim 10, wherein each of cross-sections of the first and second sub-lenses, taken in a vertical direction, has an asymmetric convex lens shape.

15. The image sensor of claim 14, wherein each of cross-sections of the first and second sub-lenses has a bar shape in a plan view.

16. The image sensor of claim 14, wherein each of cross-sections of the first and second sub-lenses has a hemispherical shape in a longitudinal cross-sectional view.

17. The image sensor of claim 10, wherein the first vertex of the first sub-lens is located between a third central vertical axis of the microlens and the first central vertical axis of the first photoelectric conversion element, and the second vertex of the second sub-lens is located between the third central vertical axis of the microlens and the second central vertical axis of the second photoelectric conversion element.

18. The image sensor of claim 10, wherein the first and second vertexes of the first and second sub-lenses located in the center of the pixel array, are closer to a third central vertical axis of the microlens than the first and second central vertical axes of the first and second photoelectric conversion elements, respectively, and the first and second vertexes of the first and second sub-lenses located at the edge of the pixel array are closer to the first and second central vertical axes of the first and second photoelectric conversion elements, respectively, than the third central vertical axis of the microlens.

19. The image sensor of claim 1, wherein the first central vertical axis vertically crosses the first photoelectric conversion element and the first sub-lens, and wherein the second central vertical axis vertically crosses the second photoelectric conversion element and the first sub-lens.

* * * * *